United States Patent
Hegedus

(10) Patent No.: US 11,205,992 B2
(45) Date of Patent: Dec. 21, 2021

(54) SOLAR PLANK SNOW FENCE

(71) Applicant: Tibor Hegedus, Colorado Springs, CO (US)

(72) Inventor: Tibor Hegedus, Colorado Springs, CO (US)

(*) Notice: Subject to any disclaimer, the term of this patent is extended or adjusted under 35 U.S.C. 154(b) by 0 days.

(21) Appl. No.: 17/018,821

(22) Filed: Sep. 11, 2020

(65) Prior Publication Data

US 2021/0083619 A1  Mar. 18, 2021

Related U.S. Application Data

(60) Provisional application No. 62/899,220, filed on Sep. 12, 2019.

(51) Int. Cl.
*H02S 20/32* (2014.01)
*H02S 20/10* (2014.01)
*H01F 7/20* (2006.01)
*E01F 7/02* (2006.01)

(52) U.S. Cl.
CPC ............. *H02S 20/32* (2014.12); *E01F 7/025* (2013.01); *H02S 20/10* (2014.12)

(58) Field of Classification Search
CPC .......... H02S 20/32; H02S 20/10; E91F 7/025
See application file for complete search history.

(56) References Cited

U.S. PATENT DOCUMENTS

| 2011/0277815 A1* | 11/2011 | Sankrithi | F24S 20/80 136/246 |
| 2016/0099369 A1* | 4/2016 | Eickelmann | H01L 31/18 136/255 |
| 2016/0308488 A1* | 10/2016 | Liu | H02S 40/34 |

FOREIGN PATENT DOCUMENTS

JP  20033147729  *  5/2003

* cited by examiner

*Primary Examiner* — Jayne L Mershon
(74) *Attorney, Agent, or Firm* — Hall Estill Law Firm

(57) ABSTRACT

The disclosed solar plank snow fence performs two separate but unique functions in one structure. The structure is capable of harnessing solar power through the use of photovoltaics to produce electricity and acting as a snow fence to minimize the effects of blowing snow down-wind from the structure. In embodiments, based on weather conditions, detected at a site by sensors utilized by the solar snow fence, the disclosed fence is capable of autonomously transitioning between solar tracking mode and snow fence mode according to weather conditions. In snow fence mode, the disclosed solar plank snow fence performs the function of a snow fence with a tracking position fixed to a predetermined position or angle. In embodiments, the tracking position (angle) may be between 0° and 15° relative to the ground and may be positioned facing the prevailing wind direction.

8 Claims, 6 Drawing Sheets

SOLAR PLANK SNOW FENCE

CROSS REFERENCE TO RELATED APPLICATIONS

This application claims priority under 35 USC § 119(e) to U.S. Provisional Application No. 62/899,220 filed Sep. 12, 2019, which is herein incorporated by reference in its entirety.

BACKGROUND OF THE DISCLOSURE

Field of the Invention

The present disclosure is directed to fencing, and more particularly, snow barrier fencing that includes solar panels or solar planks.

Description of the Related Art

Blowing and drifting snow is a significant problem in areas with significant snowfall. Blowing and drifting snow onto roadways is a safety and maintenance problem for many US states that experience significant snowfall. Current state-of-the-art methods to mitigate blowing and drifting snow onto roadways includes plowing, the use of wooden snow fences, and the use of plant or vegetation-based snow fences.

Plowing is expensive and is limited in operation and effectiveness during periods of high wind conditions. Wooden snow fences have been in use for many years but require preplanning and installation prior to a blowing and drifting snow event. Furthermore, a traditional wooden snow fence, once installed, remains in place year-round but is only utilized during the winter months during snow events. In addition, wooden snow fences require periodic maintenance and upkeep and are limited to a 20 to 25-year lifetime if properly maintained. Wooden snow fences are also susceptible to rot and wildfires.

Planted vegetation, e.g., trees, can also form a snow barrier. Planted vegetation as a snow barrier requires significant advance effort since the plants must first be planted and allowed to mature. Plant-based snow fences are also vulnerable to drought, wildfire, insect infestation, and disease.

Accordingly, improved snow barriers in regions that see significant snowfall are needed.

SUMMARY OF THE INVENTION

The disclosed solar plank snow fence performs two separate but unique functions in one structure. The structure is capable of 1) harnessing solar power through the use of photovoltaics to produce electricity, and 2) acting as a snow fence to minimize the effects of blowing snow down-wind from the structure.

As compared to a wooden snow fence, the disclosed solar snow fence is capable of harnessing solar energy year-round in addition to simultaneously providing the benefit of capturing blowing and drifting snow when needed during the winter months. The solar snow fence is thus capable of providing year-round benefits of renewable energy generation and snow drift mitigation.

As compared to a single-axis solar tracker, the solar snow fence is capable of positioning itself to capture blowing and drifting snow which is enabled by a higher porosity in the structure's design, e.g., with solar planks with vertical gaps in-between the planks. Additionally, single-axis solar trackers can typically enter into a complete horizontal stow mode in high wind conditions in order to minimize wind loading. The disclosed solar snow fence is capable of being positioned in the near vertical position when high winds and snow are present. In embodiments, the positioning is done automatically using data from affiliated environmental sensors.

After a snow fall event, when winds have decreased and snowing has ceased, the solar plank snow fence can transition to solar mode. In embodiments, the use of bifacial solar cells in the solar planks can take advantage of the higher albedo created by snow-covered ground, and thereby increase solar energy power production.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
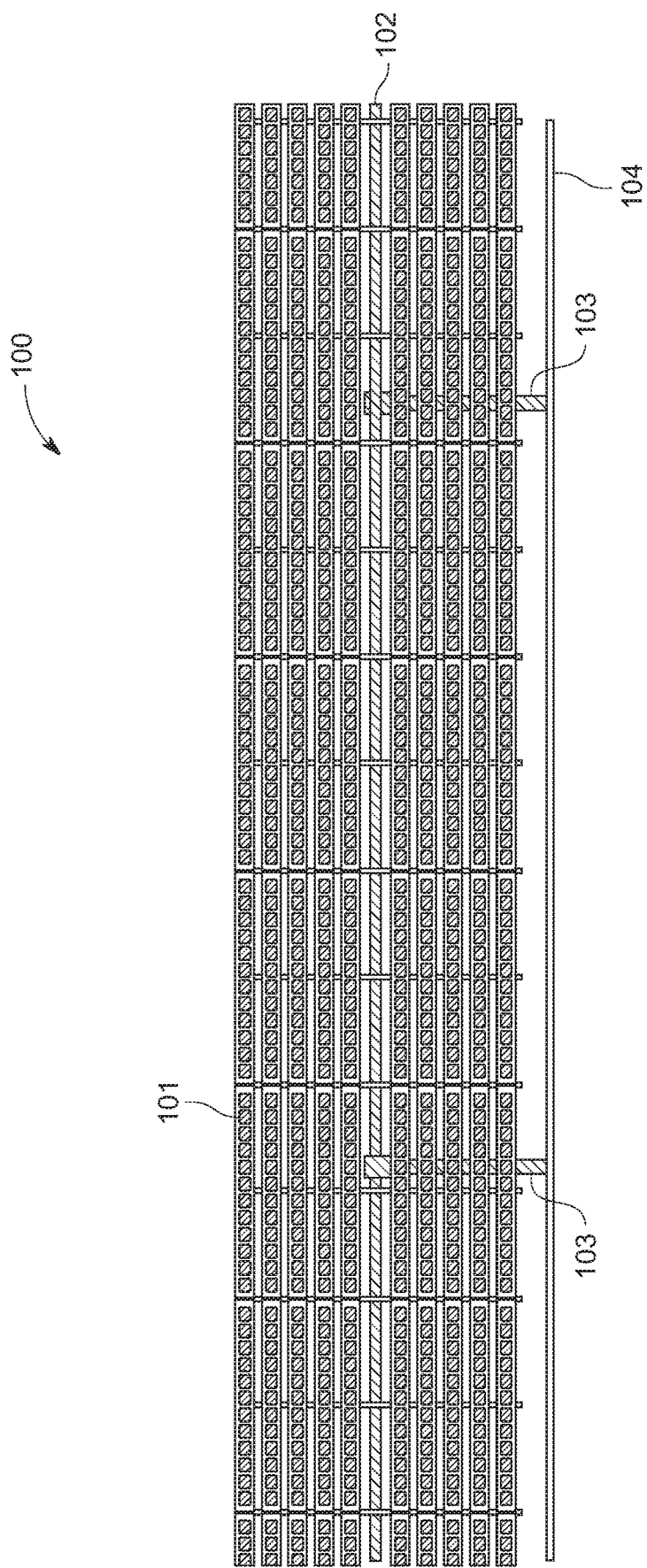
FIG. 1 shows one embodiment of a solar snow fence of the disclosure.

The following detailed description is provided to assist the reader in gaining a comprehensive understanding of the methods, products, and/or systems, described herein. However, various changes, modifications, and equivalents of the methods, products, and/or systems described herein will be apparent to an ordinary skilled artisan.

The disclosed solar plank snow fence is composed of solar panels (or solar planks) approximately one solar cell wide, and a length dependent on the total number of solar cells connected in series (known as a "string"). The solar cells can be either mono-facial i.e., one side of the solar cell is capable of harnessing solar energy, or bi-facial i.e., both sides of the solar cell are capable of harnessing solar energy.

The solar planks are mounted on to a single axis solar tracker, with the vertical spacing between the planks achieving a structural porosity of the entire structure between 25% to 75%. The height of the structure can be adjusted based on a site's snow barrier requirement(s), with an additional row of solar planks (and associated spacing between rows) being added. Likewise, the width of the structure can be adjusted as needed to meet a site's snow barrier requirements by adding additional sections of solar planks and supporting frame(s).

In solar tracking mode, the structure performs functions similar to a single axis solar tracker with the tracker making slow and near continuous adjustments e.g., autonomously via sensors, controllers, and motors, to track the sun in the day sky and maximize the capture of solar energy on the solar cells located in the solar planks.

In snow fence mode, the structure performs the function of a snow fence, with its tracking position fixed to a predetermined position, usually between 0 degrees (vertical position) to 15 degrees and facing the prevailing wind direction.

In embodiments, the disclosed solar snow fence including solar panels or solar planks that may be connected in series or in parallel. The solar planks may be approximately one solar cell wide and have a length that is dependent on the total number of solar cells.

The solar planks may be mounted onto a single axis solar tracker. The mounting provides spacing between each row of solar planks and may be considered analogous to the design of a wooden snow fence. The height, length, and porosity of the fence can be varied based on the application site and snow barrier requirements. As mentioned above, the disclosed solar snow fence may have two modes of operation, i.e., solar tracking mode and snow fence mode.

In embodiments, based on weather conditions, detected at a site by sensors utilized by the solar snow fence, the disclosed fence is capable of autonomously transitioning between solar mode and snow fence mode according to weather conditions.

In snow fence mode, the disclosed solar plank snow fence performs the function of a snow fence with a tracking position fixed to a predetermined position or angle. In embodiments, the tracking position (angle) may be between 0° and 15° and may be positioned facing the prevailing wind direction.

FIG. 1 shows one embodiment of a solar plank snow fence 100 of the disclosure. FIG. 1 shows solar planks 101, torque beam 102, torque beam posts 103, and ground 104. In this example, the ground clearance may be about 15 inches.

Figure 2:
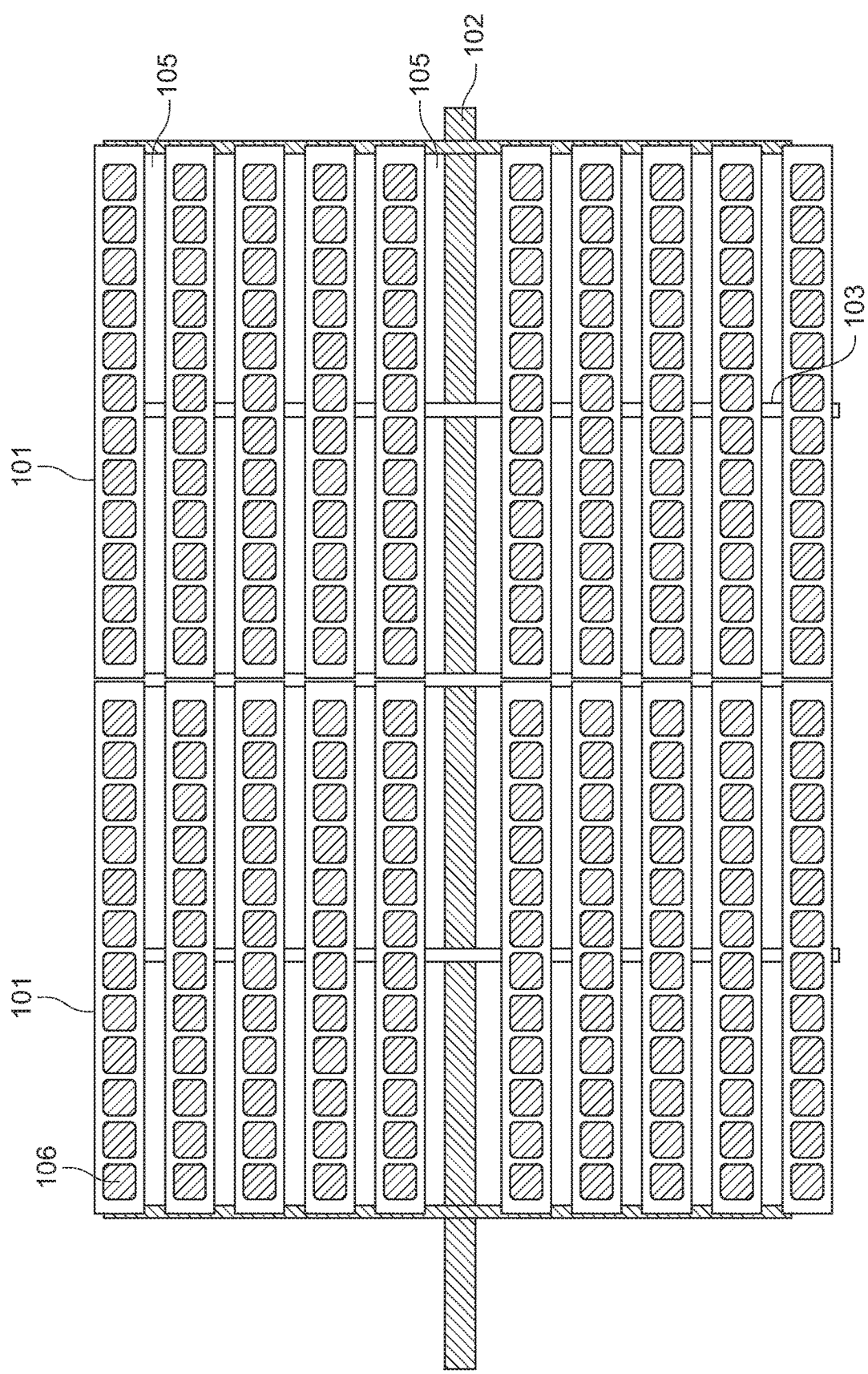
FIG. 2 shows another embodiment of the solar plank snow fence of the disclosure.

FIG. 2 shows another embodiment of a solar plank snow fence of the disclosure. FIG. 2 shows solar cells 106 and gaps 105 between solar planks 101. The gaps 105 are variable in width and are thus one variable that allows the total height of the solar plank snow fence to be changed. The number of solar planks 101 may also be varied to adjust the height as well.

Figure 3A:
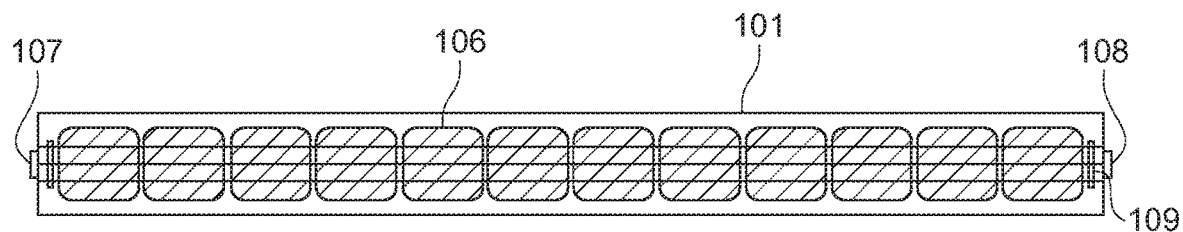
FIG. 3A shows an embodiment of a solar plank of the disclosure.

FIG. 3A shows an embodiment of solar plank 101 of the disclosure. FIG. 3A shows solar cells 106 positive and negative electrical connections 107, 108 and wiring 109 which in this embodiment connects the solar cells in series. The width of the solar plank shown in FIG. 3A is variable based on the number of solar cells. In this example, the height is approximately 7 inches and the width is approximately 75 inches.

Figure 3B:
FIG. 3B shows a side view of a solar plank of the disclosure.

FIG. 3B shows a side view of a solar plank 101 of the disclosure.

Figure 3C:
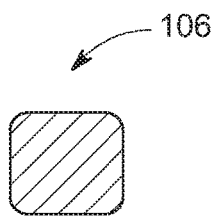
FIG. 3C shows an embodiment of a solar cell of the disclosure.

FIG. 3C shows an embodiment of a solar cell 106 of the disclosure. In this example, the solar cell 106 may be approximately 5 to 6 inches in height.

Figure 3D:
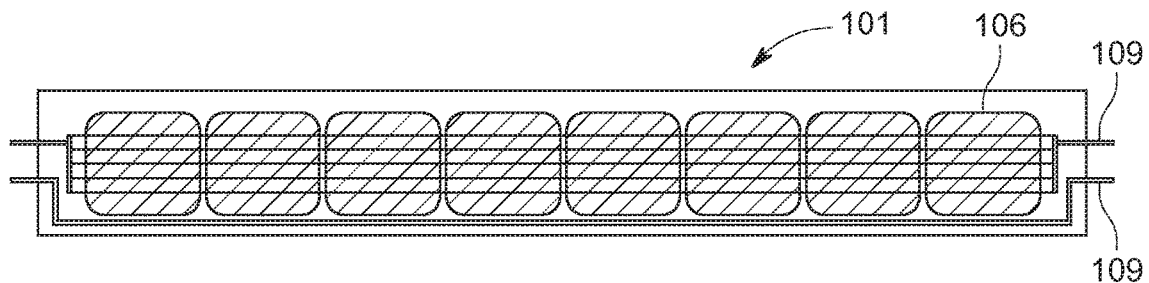
FIG. 3D shows another embodiment of a solar plank of the disclosure.

FIG. 3D shows another embodiment of a solar plank 101 of the disclosure. FIG. 3D shows a solar plank with eight solar cells 106 as well as wiring 109 connecting the solar cells 106.

Figure 4:
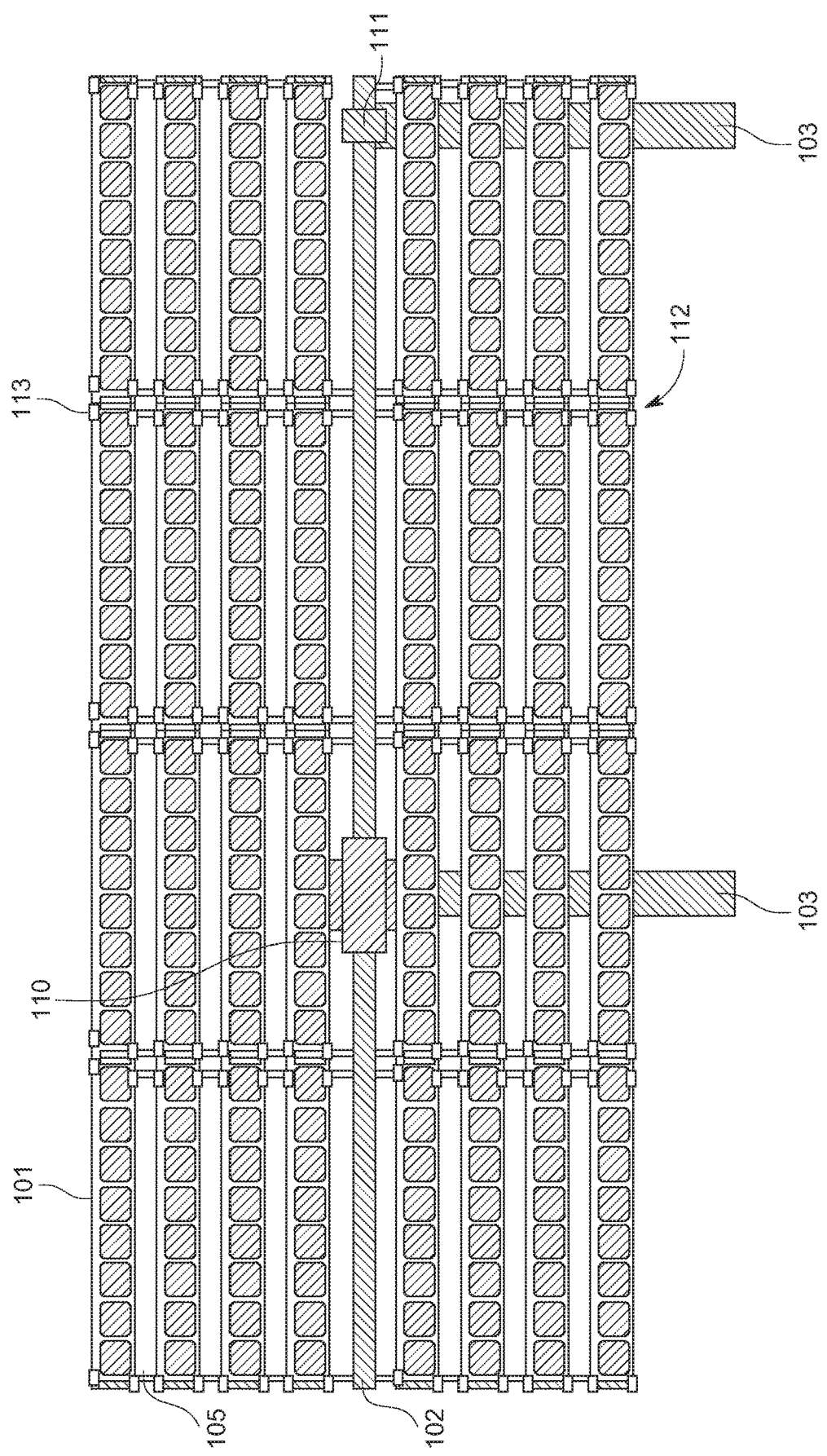
FIG. 4 shows another embodiment of the solar plank snow fence of the disclosure.

FIG. 4 shows another embodiment of the solar plank snow fence of the disclosure. FIG. 4 additionally shows slew drive 110 and pillow block bearing 111 as well as panel mounting rails 112 and solar clamp 113.

Figure 5A:
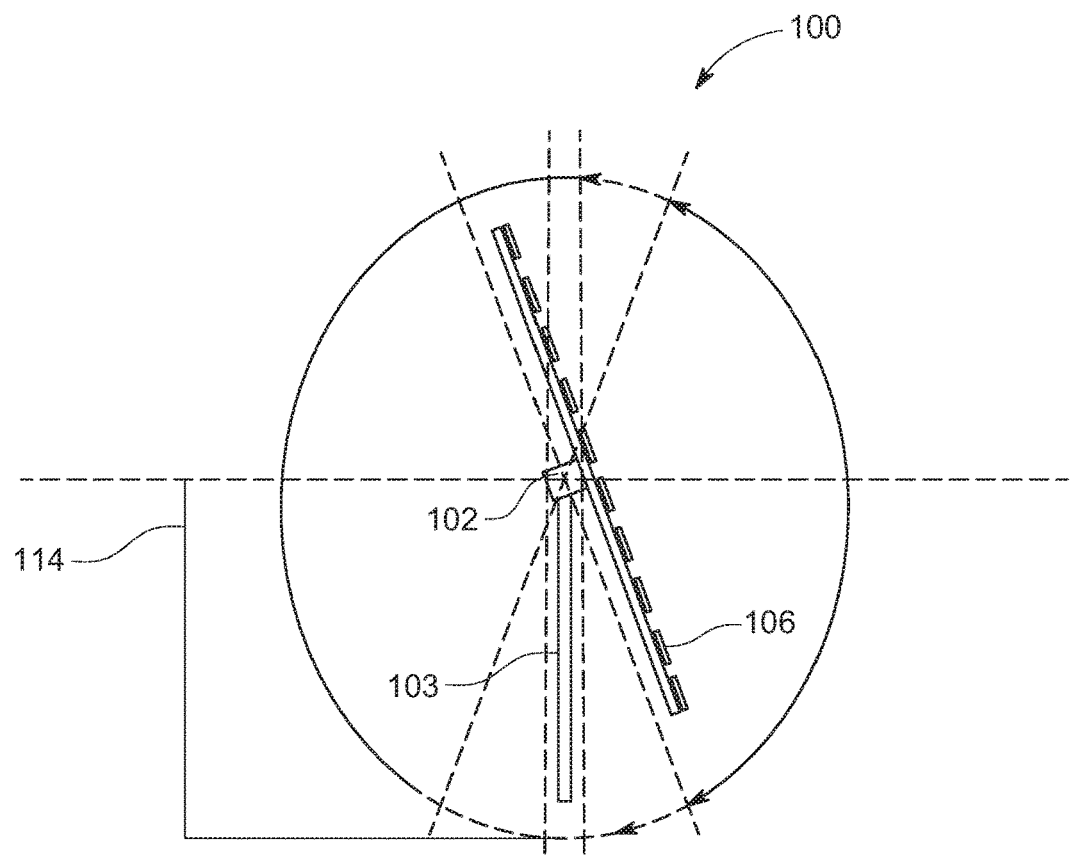
FIG. 5A shows a side view of another embodiment of a solar plank snow fence of the disclosure.

FIG. 5A shows a side view of another embodiment of a solar plank snow fence of the disclosure. The solar plank snow fence shown in FIG. 5A is shown with a single axis solar tracking motion (can modify tracking to full vertical stow). FIG. 5A illustrates a 15° solar snow fence stow mode. The dashed lines show a range of motion varying from about 165° to 180°. The height 114 shown in FIG. 4A is variable and may be determined by a site's snow barrier requirements.

Figures 5B, 5C:
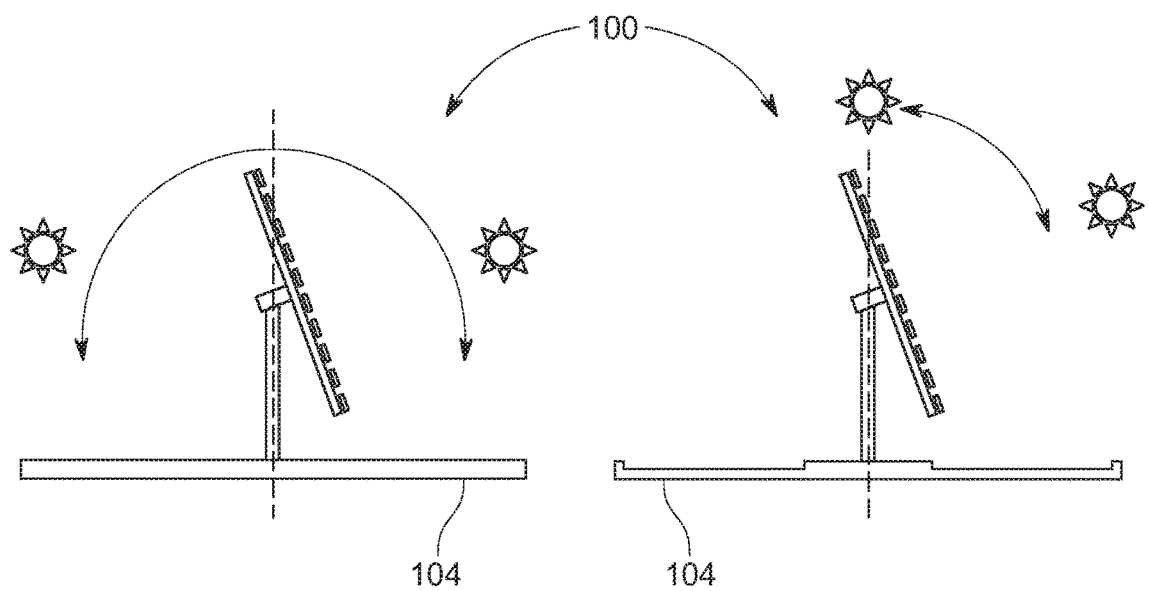
FIG. 5B shows another embodiment of a solar plank snow fence of the disclosure.
FIG. 5C show another embodiment of a solar plank snow fence of the disclosure.

FIG. 5B and FIG. 5C show further embodiments of solar plank snow fences 100 of the disclosure. FIG. 5B shows a North-South solar plank snow fence orientation. In this embodiment, there is single axis 180° solar tracking motion (daily). Tracking can be modified to full vertical stow when dictated by environmental conditions. FIG. 5C shows an East-West solar snow fence orientation. In this embodiment, there is single axis 90+° solar tracking motion (seasonal). Tracking can be modified to full vertical stow when dictated by environmental conditions.

Figure 6:
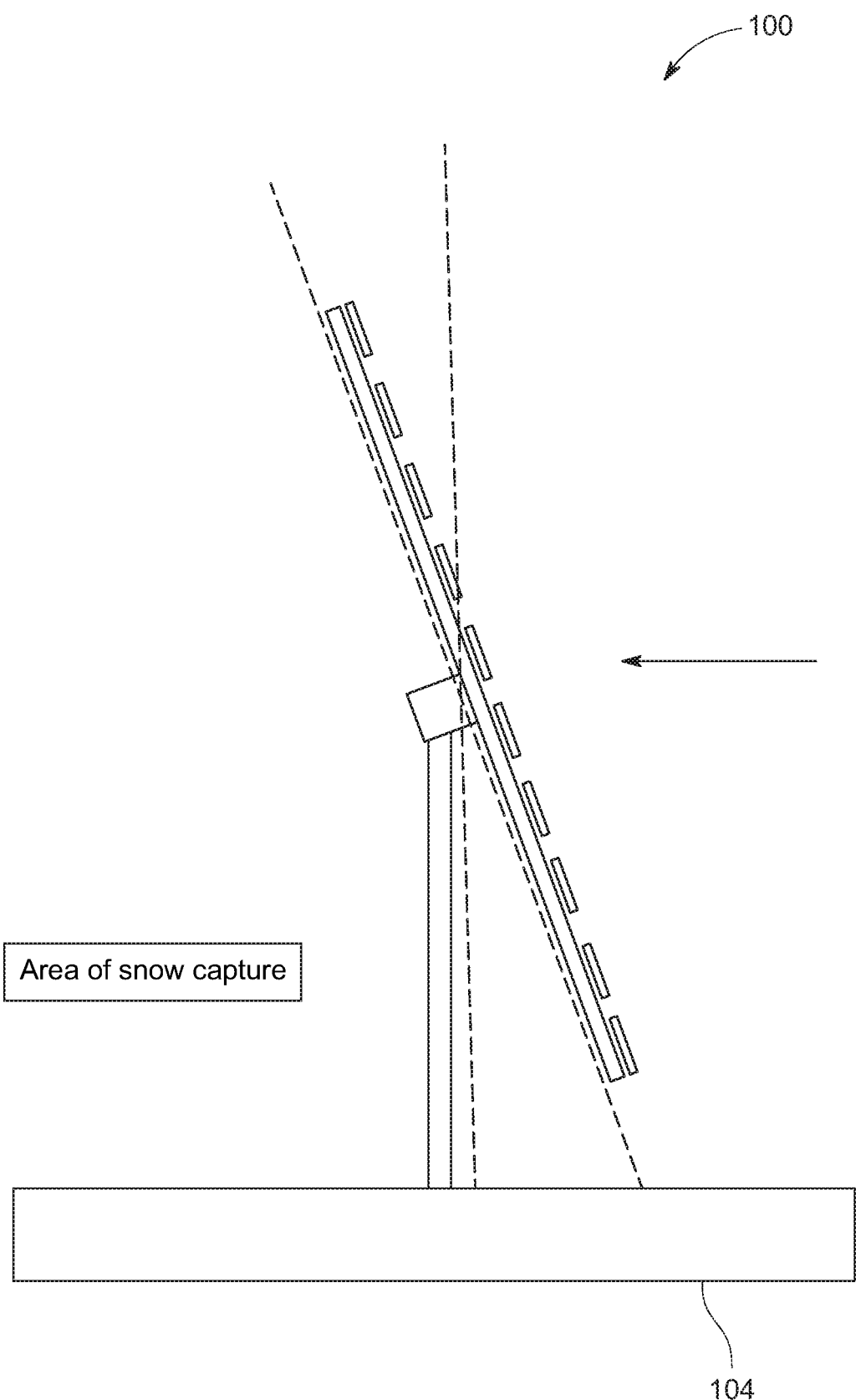
FIG. 6 shows another embodiment of an installed solar plank snow fence of the disclosure.

FIG. 6 shows another embodiment of an installed solar plank snow fence 100 of the disclosure. The dashed lines show a range of 0 to 15°. The arrow indicates the direction of the prevailing wind and blowing snow.

In embodiments, the solar cells can be mono-facial, bi-facial (either monocrystalline or polycrystalline), thin film, or a combination of technologies known as heterojunction technology.

In embodiments, the number of busbars connecting the solar cells can vary (e.g., 3 or more).

In embodiments, the solar planks can be frameless (e.g., all glass) or framed in metal.

In embodiments, the solar planks can have a positive terminal on one end and a negative terminal on the other end; alternatively, the solar planks may have a positive and negative terminal on the same end.

In embodiments, the planks can be connected in series and/or in parallel, depending on the electrical requirements.

In embodiments, the total height of the solar plank snow fence can increase by adding additional rows of solar planks.

In embodiments, the total length of the solar plank snow fence can be increased by adding additional planks.

In embodiments, vertical gaps between the solar planks can be adjusted based on the porosity requirement for the site (e.g., between 25% to 75%).

In embodiments, the gap from the ground to the bottom of the first plank (when the structure is in snow fence mode) can be adjusted based on site requirements (e.g., 15 inches).

In embodiments, the snow fence mode stow angle can be adjusted between 0 to 15 degrees as needed for site conditions.

In embodiments, the disclosed solar plank snow fence can be configured to automatically and/or manually transition between snow fence mode and solar mode by user input.

In embodiments, the disclosed solar plank snow fence can be directly connected to a utility grid or operate off-grid.

In embodiments, the disclosed solar plank snow fence can be connected to an energy storage device (e.g., battery energy storage system).

As used herein, the term solar panel refers to a photovoltaic module including an assembly of photo-voltaic or solar cells mounted in a framework. Photo-voltaic cells use sunlight as a source of energy and generate direct current electricity.

As used herein, the term solar plank refers to a solar panel that comprises one or more solar cells disposed adjacent to each other in a linear direction.

As used herein, the term environmental sensors refers to sensors that are capable of detecting weather-related information including but not limited to wind velocity and direction, light, temperature, humidity, barometric pressure, etc.

As used herein, environmental sensors associated with a solar plank snow fence refers to environmental sensors that are capable of transmitting data to a controller which controls the angle of the solar planks relative to the ground. This can refer to sensors directly attached to the solar plank snow fence or in a nearby location capable of transmitting data to a controller of the solar plank snow fence.

As referred to herein, environmental or weather conditions generally refers to wind direction and velocity, temperature, humidity, barometric pressure, dew point, sunlight intensity, as well as sunlight, temperature, wind, and barometric changes over time. Environmental or weather conditions also generally refers to all parameters typically used to monitor and predict weather conditions.

While this disclosure includes specific examples, it will be apparent after an understanding of the disclosure of this application has been attained that various changes in form and details may be made in these examples without departing from the spirit and scope of the claims and their equivalents.

I claim:

1. A solar plank snow fence comprising:
   a torque beam post;
   a torque beam connected to the torque beam post;
   panel mounting rails connected to the torque beam;
   one or more solar panels connected to the panel mounting rails; and
   a sensor to measure environmental conditions and a controller;
   wherein when predetermined values are met, the sensor provides input to a controller to configure the solar panels to be positioned stationary at an angle ranging from 0° from vertical to 15° from vertical to face the climatic winter-season prevailing wind direction to bank blowing snow downwind of the solar plank snow fence; and
   wherein when predetermined values are not met, the sensor provides input to the controller to configure the solar panels to be positioned and make adjustments to track the sun in the daytime sky to produce electricity.

2. The solar plank snow fence of claim 1, wherein the solar panels are generally disposed horizontal to the ground and arranged in a vertical stack with adjustable spaces in between the vertical stack in order to achieve a structural porosity between 25% to 75%.

3. The solar plank snow fence of claim 1, further comprising a slew drive.

4. The solar plank snow fence of claim 1, further comprising a pillow block bearing.

5. The solar plank snow fence of claim 1, wherein the solar cells are mono-facial and/or bi-facial.

6. The solar plank snow fence of claim 1, wherein the solar cells are monocrystalline, polycrystalline, thin film and/or heterojunction.

7. The solar plank snow fence of claim 1, wherein the solar planks are connected to an energy storage device.

8. The solar plank snow fence of claim 1, wherein the solar panels are connected to a utility grid.

* * * * *